(12) United States Patent
Andersson et al.

(10) Patent No.: US 9,388,487 B2
(45) Date of Patent: Jul. 12, 2016

(54) NANOLAMINATED COATED CUTTING TOOL

(71) Applicant: SECO TOOLS AB, Fagersta (SE)

(72) Inventors: Jon Andersson, Vasteras (SE); Mats Johansson, Linkoping (SE)

(73) Assignee: SECO TOOLS AB, Fagersta (SE)

( * ) Notice: Subject to any disclaimer, the term of this patent is extended or adjusted under 35 U.S.C. 154(b) by 0 days.

(21) Appl. No.: 14/382,854

(22) PCT Filed: Mar. 6, 2013

(86) PCT No.: PCT/EP2013/054514
§ 371 (c)(1),
(2) Date: Sep. 4, 2014

(87) PCT Pub. No.: WO2013/131961
PCT Pub. Date: Sep. 12, 2013

(65) Prior Publication Data
US 2015/0023751 A1    Jan. 22, 2015

(30) Foreign Application Priority Data
Mar. 7, 2012   (EP) .................................... 12158414

(51) Int. Cl.
*C23C 14/06* (2006.01)
*C23C 14/32* (2006.01)
(Continued)

(52) U.S. Cl.
CPC ........... *C23C 14/0641* (2013.01); *B23B 27/148* (2013.01); *B23C 5/20* (2013.01); *C23C 14/0652* (2013.01); *C23C 14/32* (2013.01);
(Continued)

(58) Field of Classification Search
USPC ............ 51/307, 309; 424/216, 336, 697, 698, 424/699; 204/192.1, 192.15, 192.16
See application file for complete search history.

(56) References Cited

U.S. PATENT DOCUMENTS 5,700,551 A * 12/1997 Kukino ............... C04B 35/5831
428/216

FOREIGN PATENT DOCUMENTS

| DE | 102010039035 A1 | 2/2012 |
| JP | 2005028476 A | 2/2005 |
| JP | 2008302474 A | 12/2008 |
| WO | 2010140958 A1 | 12/2010 |
| WO | 2010140959 A1 | 12/2010 |

OTHER PUBLICATIONS

Paldey et al. "Single layer and multilayer wear resistant coatings of (Ti, Al)N: a review". Materials Science and Engineering, vol. A342, 203-01-01, pp. 58-79.

(Continued)

*Primary Examiner* — Archene Turner
(74) *Attorney, Agent, or Firm* — Corinne R. Gorski

(57) ABSTRACT

A cutting tool insert for machining by chip removal includes a body of a hard alloy of cemented carbide, cermet, ceramics, cubic boron nitride based material or high speed steel, onto which a hard and wear resistant coating is deposited. The coating includes at least one polycrystalline nanolaminated structure having sequences of alternating A and B layers, wherein layer A is $(Al_{x1}Me1_{1-x1})N_{y1}$ with $0.3<x1<0.95$, $0.9<y1<1.1$ and Me1 is one or more of the elements Ti, Y, V, Nb, Mo, Si and W, or Me1 is Ti and one or more of the following elements Y, V, Nb, Mo, Si, Cr and W, and layer B is $(Zr_{1-x2-z2}Si_{x2}Me2_{z2})N_{y2}$ with $0<x2<0.30$, $0.90<y2<1.20$, $0 \le z2<0.25$ and Me2 is one or more of the elements Y, Ti, Nb, Ta, Cr, Mo, W and Al.

26 Claims, 1 Drawing Sheet

(51) Int. Cl.
*C23C 30/00* (2006.01)
*B23B 27/14* (2006.01)
*B23C 5/20* (2006.01)

(52) U.S. Cl.
CPC ............ *C23C 14/325* (2013.01); *C23C 30/005* (2013.01); *B23B 2224/00* (2013.01); *B23C 2224/00* (2013.01); *Y10T 409/303808* (2015.01); *Y10T 428/24975* (2015.01)

(56) References Cited

OTHER PUBLICATIONS

Martin et al. "Nanocomposite Ti-Si-N, Zr-Si-N, Ti-Al-Si-N, Ti-Al-V-Si-N thin film coatings deposited by vacuum arc deposition", Surface and Coatings Technology, Elsevier, Amsterdam, NL, vol. 200, No. 7, Dec. 21, 2005, pp. 2228-2235.

* cited by examiner

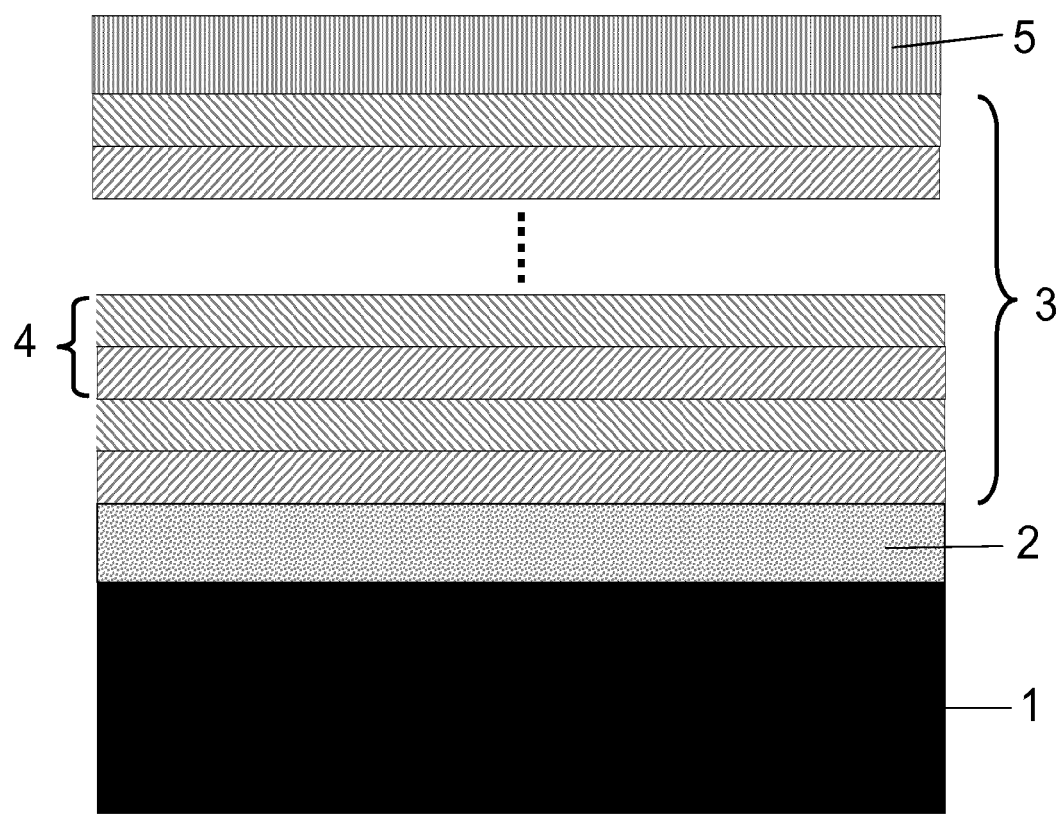

NANOLAMINATED COATED CUTTING TOOL

RELATED APPLICATION DATA

This application is a §371 National Stage Application of PCT International Application No. PCT/EP2013/054514 filed Mar. 6, 2013 claiming priority of EP Application No. 12158414.8, filed Mar. 7, 2012.

TECHNICAL FIELD

The present invention relates to a cutting tool insert coated with a hard and wear resistant PVD, physical vapor deposition, coating comprising a nanolaminated structure based on alternating Zr—Si- and Al-based nitride layers, respectively. The invention also relates to a method for coating the insert and the use thereof.

BACKGROUND OF THE INVENTION

TiN has been widely used as a hard and wear resistance layer on cutting tools. However, due to its relatively poor oxidation resistance at elevated temperatures, the focus has shifted towards more complex ternary and quaternary compounds, e.g., as in the (Ti,Al)N and (Ti,Si)N systems that show improved properties that enables greater cutting speeds, prolonged tool life and machining of harder materials in a wide range of metal cutting applications.

CN 101338411 discloses Zr—Si—N layers grown by co-sputtering of pure Zr and pure Si targets in a mixed argon and nitrogen discharge on substrates to a total thickness of 2 to 3 µm.

EP 1736565 discloses a cutting tool insert, solid end mill, or drill, comprising a body and a coating composed of one or more layers of refractory compounds of which at least one layer comprises a cubic (Me,Si)X phase, where Me is one or more of the elements Ti, V, Cr, Zr, Nb, Mo, Hf, Ta and Al, and X is one or more of the elements N, C, O or B.

U.S. Pat. No. 7,056,602 discloses a cutting tool insert coated with a cubic structured $(Ti_yAl_xMe_{1-x-y})N$ based layer where Me is one of the elements: Zr, Hf, V, Nb, Ta, Cr, Mo, W or Si, and: x is between 0.50 and 0.80; the ratio, x/(x+y), is between 0.50 and 0.85; the sum of Ti and Al subscripts, x+y, is between 0.7 and 1.0.

Coating optimization has also been obtained by applying different concepts of multilayers as; alternating Ti and Al containing layers (U.S. Pat. No. 6,309,738), oxygen and non-oxygen containing layers (U.S. Pat. No. 6,254,984), one of the layers stacked in the multilayer consists itself of a multilayer (U.S. Pat. No. 6,077,596), alternating nitrogen content (U.S. Pat. No. 5,330,853) or using one metastable compound (U.S. Pat. No. 5,503,912) or as aperiodic multilayer (U.S. Pat. No. 6,103,357).

WO 2010140958 discloses a cutting tool insert coated with a polycrystalline nanolaminated structure of alternating layers A and B where layer A is (Ti,Al,Me1)N and Me1 is optionally one or more of the elements from group 3, 4, 5 or 6 in the periodic table, layer B is (Ti, Si, Me2)N and Me2 is optionally one or more of the elements from group 3, 4, 5 or 6 in the periodic table including Al with improved cutting performance in applications generating high work temperatures.

JP 2008 302 474 discloses a cutting tool insert coated with an alternating laminated structure comprising a first single layer of (Zr,Si)N and thereon alternating layers of (Al, Cr)N and (Zr,Si)N.

Today industry continuously seeks solutions for economic and high productivity/feed-through manufacturing. To meet these demands there is a need for new materials with advanced properties to improve tool life during operation. Within the metal cutting tool industry, a major part of this effort is focused to improve the wear behavior of the cutting tools by designing the properties of the coating material used in the application. Typically, a high productivity/feed-through cutting process results in a dramatic increase of the tool temperature and hence a coating material with a high temperature wear resistance is essential.

OBJECT OF THE INVENTION

It is an object of the present invention to provide a coated cutting tool insert with improved performance in metal cutting applications at elevated temperatures.

It is a further object of the present invention to provide a coated cutting tool insert with improved wear resistant properties.

SUMMARY OF THE INVENTION

According to a first aspect of the invention the object is achieved by a cutting tool insert for machining by chip removal comprising a body of a hard alloy of cemented carbide, cermet, ceramics, cubic boron nitride based material or high speed steel, preferably cemented carbide and cermet, onto which a hard and wear resistant coating is deposited, wherein said coating comprises at least one polycrystalline nanolaminated structure comprising sequences of alternating A and B layers, where said layer A is $(Al_{x1}Me1_{1-x1})N_{y1}$ with $0.3<x1<0.95$, $0.9<y1<1.1$ and Me1 is one or more of the elements Ti, Y, V, Nb, Mo, Si and W, or Me1 is Ti and one of the following elements Y, V, Nb, Mo, Si, Cr and W, and said layer B is $(Zr_{1-x2-z2}Si_{x2}Me2_{z2})N_{y2}$ with $0<x2<0.30$, $0.90<y2<1.20$, $0 \le z2<0.25$ and Me2 is one or more of the elements Y, Ti, Nb, Ta, Cr, Mo, W and Al, the average individual thickness of A and B layers is between 1 nm and 50 nm, and the nanolaminated structure has a thickness between 0.5 µm and 15 µm. By combining sequences of alternating (Zr, Si)- and Al-based nitride layers in the nanolaminated coating structure on the cutting tool insert, the tool life is significantly improved due to increased wear resistance and edge integrity, especially in machining operations at elevated temperatures.

According to one embodiment of the invention the layer A is $(Ti_{1-x1-z1}Me1_{z1})N_{y1}$, where $0.3<x1<0.95$, $0.9<y1<1.1$, $0 \le z1<0.25$, and $(1-x1-z1)>0$, and Me1 is one or more of the elements Y, V, Nb, Mo, Si, Cr and W.

According to one embodiment of the invention $0.45<x1<0.75$.

According to one embodiment of the invention $0.96<y1<1.04$.

According to one embodiment of the invention $0<x2<0.15$.

According to one embodiment of the invention $0.90<y2<1.10$.

According to one embodiment of the invention $0 \le z1<0.15$.
According to one embodiment of the invention $0 \le z2<0.15$.
According to one embodiment of the invention $z1=0$.
According to one embodiment of the invention $z2=0$.

According to one embodiment of the invention the nanolaminated structure comprises a phase mixture of cubic and hexagonal phases.

According to one embodiment of the invention the nanolaminated structure comprises cubic crystalline phases, preferably NaCl phases.

According to one embodiment of the invention the coating consists of an innermost single layer and/or multilayer (2) comprising, e.g., TiN, TiC, Ti(C,N) or (Ti,Al)N, preferably a single layer of (Ti,Al)N, followed by said nanolaminated structure (3) and optionally an outer single layer and/or multilayer (5) comprising, e.g., TiN, TiC, Ti(C,N) or (Ti,Al)N, preferably a single layer of TiN, said coating having a total thickness between 1 μm and 20 μm.

According to a second aspect of the invention the object is achieved by a method for making a hard and wear resistant coating by growing a nanolaminated structure comprising sequences of alternating A: (Al, Me1) and B: (Zr,Si,Me2)N layers by PVD, preferably by cathodic arc evaporation, using fixture rotations and at least two opposing and different composite and/or alloyed cathodes for the A and B layers, respectively, where Me1 is one or more of the elements: Ti, Y, V, Nb, Mo, Si and W, or Me1 is Ti and one of the following elements Y, V, Nb, Mo, Si, Cr and W, and Me2 is one or more of the elements: Y, Ti, Nb, Ta, Cr, Mo, W and Al in a reactive atmosphere containing $N_2$, optionally with a carrier gas, e.g. Ar, at a total gas pressure between 1.0 Pa and 7.0 Pa, preferably between 1.5 Pa and 4.0 Pa, an evaporation current between 50 A and 200 A, a negative substrate bias between 0 V and 300 V, preferably between 10 V and 150 V, most preferably between 15 V and 100 V, and a deposition temperature between 200° C. and 800° C., preferably between 300° C. and 600° C.

According to a third aspect of the invention the object is achieved by use of a cutting tool insert for machining by chip removal, specifically generating high temperatures, at cutting speeds of 50-400 m/min, 75-300 m/min, with an average feed, per tooth in the case of milling, of 0.08-0.5 mm, preferably 0.1-0.4 mm, depending on cutting speed and insert geometry.

BRIEF DESCRIPTION OF THE DRAWINGS

FIG. 1 is a schematic drawing of one embodiment of the present invention showing the coating structure as it would appear in a cross sectional scanning electron microscope (SEM) micrograph.

DETAILED DESCRIPTION OF PREFERRED EMBODIMENTS

According to one embodiment of the invention, there is provided a cutting tool insert for machining by chip removal comprising a body 1 of a hard alloy of cemented carbide, cermet, ceramics, cubic boron nitride based material or high speed steel, preferably cemented carbide and cermet, onto which a hard and wear resistant coating is deposited comprising at least one polycrystalline nanolaminated structure 3 comprising sequences 4 of alternating A and B layers with a thickness of the nanolaminated structure between 0.5 and 15 μm, preferably between 0.5 and 10 μm, most preferably between 0.5 and 5 μm. The nanolaminated structure has an overall columnar structure with average column width between 20 and 1000 nm, preferably between 20 and 500 nm, as estimated from measurements by, e.g., cross section transmission electron microscopy of a middle region of the nanolaminated structure, i.e., in a region within 30 to 70% of the thickness in the growth direction, and said average column width is the average of at least ten adjacent columns Said layer A is $(Al_{x1}Me1_{1-x1})N_{y1}$, where $0.3<x1<0.95$, preferably $0.45<x1<0.75$, $0.9<y1<1.1$, preferably $0.96<y1<1.04$, and Me1 is one or more of the following elements Ti, Y, V, Nb, Mo, Si and W, or Me1 is Ti and one or more of the following elements: Y, V, Nb, Mo, Si, Cr and W. Preferably Me1 is one or more of the elements Ti, Si and Nb.

Said layer B is $(Zr_{1-x2-z2}Si_{x2}Me2_{z2})N_{y2}$ with $0<x2<0.30$, preferably $0<x2<0.15$, most preferably $0<x2<0.085$, $0.90<y2<1.20$, preferably $0.90<y2<1.10$, $0 \leq z2<0.25$, preferably $0 \leq z2<0.15$, most preferably $0<z2<0.10$, and Me2 is one or more of the elements Y, Ti, Nb, Ta, Cr, Mo, W and Al, preferably one or more of the elements Ti, Ta and Cr, most preferably one or more of the elements Ta and Cr.

Said A and B layers have an average individual layer thickness between 1 nm and 50 nm, preferably between 1 nm and 30 nm, most preferably between 2 nm and 20 nm, as estimated from measurements by, e.g., cross sectional transmission electron microscopy in a middle region of the nanolaminated structure, i.e., in a region within 30 to 70% of its thickness in the growth direction, and said average individual layer thickness is the average thickness of at least ten adjacent layers.

Unintentional and small, aperiodic and/or periodic, thickness variation of layer A and B is common to the coating process due to, e.g., normal process variations, fixturing arrangement and rotation of the inserts during growth.

Said nanolaminated structure comprises, for example, a phase mixture of cubic and hexagonal phases as determined by X-ray diffraction. According to one embodiment of the invention the nanolaminated structure comprises cubic phases, preferably NaCl phases, as determined by X-ray diffraction.

In one embodiment, said layer A is $(Ti_{1-x1-z1}Al_{x1}Me1_{z1})N_{y1}$, where $0.3<x1<0.95$, preferably $0.45x1<0.75$, $0.9<y1<1.1$, preferably $0.96<y1<1.04$, and $0 \leq z1<0.25$, preferably $0 \leq z1<0.15$, and Me1 is one or more of the elements Y, V, Nb, Mo, Si, Cr and W, preferably one or more of the elements Cr, V, Si and Nb, most preferably one or more of the elements Cr, Nb and Si.

The elemental composition of said A and B layers, i.e., x1, y1, z1, x2, y2 and z2, is estimated from measurements by, e.g., EDS or WDS techniques on the corresponding thick (>2 μm) monolayers. The composition of said monolayers is, within the accuracy for the measurements, essentially constant all through the monolayer thickness with a variation less than 10%, including the influence of normal process variations such as, e.g., rotation of the inserts during growth.

In one embodiment $z1=0$.
In one embodiment $z2=0$.
In one embodiment $z1=z2=0$.
In one embodiment Me1 is one or more of the elements Ti, Si and Nb.
In one embodiment Me2 is one or more of the elements Ti, Ta and Cr.

Said coating has a nanohardness >20 GPa, preferably between 25 GPa and 40 GPa, most preferably between 30 GPa and 40 GPa, as measured by nanoindentation experiments.

It is evident that said nanolaminated structure can be part of a complex coating design and used, e.g., as an inner, middle and/or outer nanolaminated structure of said complex coating.

FIG. 1 shows a schematic drawing of one embodiment of the present invention showing a coating structure where the body 1 is coated with an innermost layer 2, the nanolaminated structure 3 comprising sequences 4 of alternating A and B layers according to any of the exemplary embodiments of the invention, and an outermost layer 5.

In one embodiment, said coating consists of an innermost single layer and/or multilayer 2 comprising, e.g., TiN, TiC, Ti(C,N) or (Ti,Al)N, preferably a single layer of (Ti,Al)N, followed by said nanolaminated structure (3) and optionally an outermost single layer and/or multilayer 5 comprising, e.g., TiN, TiC, Ti(C,N) or (Ti,Al)N, preferably a single layer of TiN, said coating having a total thickness between 1 μm and 20 μm, preferably between 1 μm and 15 μm and most preferably between 1 μm and 7 μm.

The deposition method for said nanolaminated structure is based on physical vapour deposition (PVD) techniques, preferably cathodic arc evaporation, using alloyed or composite cathodes in a reactive atmosphere containing $N_2$, optionally with a carrier gas such as, e.g. Ar, at a total gas pressure between 1.0 Pa and 7.0 Pa, preferably between 1.5 Pa and 4.0 Pa, an evaporation current between 50 A and 200 A, a negative substrate bias between 0 V and 300 V, preferably between 10 V and 150 V, most preferably between 15 V and 100 V, and a deposition temperature between 200° C. and 800° C., preferably between 300° C. and 600° C. The desired A layer and B layer compositions are obtained by selecting appropriate composition of the (Al, Me1) cathode/s, where Me1 is one or more of the elements Ti, Y, V, Nb, Mo, Si and W, and composition of the (Zr,Si,Me2) cathode/s, where Me2 is one or more of the elements Y, Ti, Nb, Ta, Cr, Mo, W and Al, respectively. The cathodes are mounted on opposing sides of the deposition chamber in order to obtain the nanolaminated structure by fixture rotation where the average individual layer thickness set by the evaporation current and the rotation speed of the fixture.

The invention also relates to the use of cutting tool inserts according to the above for machining of stainless steel, super alloys and hardened steel at cutting speeds of 50-500 m/min, preferably 50-300 m/min, with an average feed of 0.08-0.5 mm/rev, preferably 0.1-0.4 mm/rev, depending on cutting speed and insert geometry.

The present invention has been described with reference to a cutting tool insert but it is evident that it also can be applied to other metal cutting tools, e.g., drills and end mills.

Example 1

Cemented carbide cutting tool inserts with composition 94 wt % WC-6 wt % Co were deposited by cathodic arc evaporation.

Before deposition, the inserts were cleaned in ultrasonic baths of an alkali solution and alcohol. The system was evacuated to a pressure of less than $2.0 \times 10^{-3}$ Pa, after which the inserts were sputter cleaned with Ar ions. The coatings were deposited from alloy or composite cathodes with a composition according to Table 1 to yield the desired composition of Layer A and Layer B, respectively, in 99.995% pure $N_2$ atmosphere at a total pressure of 2-6 Pa, using a bias of -20 to -60 V and an evaporation current of 60-200 A at 450° C. The cathodes were mounted on opposing sides of the deposition chamber in order to obtain the nanolaminated structure by fixture rotation. The average individual layer thickness was varied by altering the cathode current (60-200 A) and the rotation speed of the fixture (1-5 rpm). The total coating thickness was about 3 μm for all inserts as measured on the flank face.

The average composition of the nanolaminated structure was estimated from measurements by energy dispersive x-ray spectroscopy (EDS) analysis area using a LEO Ultra 55 scanning electron microscope operated at 10 kV and equipped with a Thermo Noran EDS detector. The data were evaluated using the Noran System Six (NSS version 2) software.

Hardness data were estimated by the nanoindentation technique of the layers after mechanical polishing of the surface using a UMIS 2000 nanoindentation system with a Berkovich diamond tip with a maximum tip load of 25 mN.

TABLE 1

| Coating Description | | Cathode composition-layer A (metal at. %) | | | | Cathode composition-layer B (metal at. %) | | |
|---|---|---|---|---|---|---|---|---|
| # | LayerA/LayerB | Ti | Cr | Al | Me1 | Zr | Si | Me2 |
| Coatings according to embodiments of the invention | | | | | | | | |
| 1 | TiAlN/ZrSiN | 33 | | 67 | | 97 | 3 | |
| 2 | TiAlN/ZrSiN | 50 | | 50 | | 97 | 3 | |
| 3 | TiAlN/ZrSiN | 60 | | 40 | | 97 | 3 | |
| 4 | TiAlN/ZrSiN | 33 | | 57 | | 95 | 5 | |
| 5 | TiAlN/ZrSiN | 50 | | 50 | | 95 | 5 | |
| 6 | TiAlN/ZrSiN | 60 | | 40 | | 95 | 5 | |
| 7 | TiAlN/ZrSiN | 33 | | 67 | | 90 | 10 | |
| 8 | TiAlN/ZrSiN | 50 | | 50 | | 90 | 10 | |
| 9 | TiAlN/ZrSiN | 60 | | 40 | | 90 | 10 | |
| 10 | TiAlN/ZrSiN | 33 | | 67 | | 95 | 5 | |
| 11 | TiAlN/ZrSiN | 50 | | 50 | | 95 | 5 | |
| 12 | TiAlN/ZrSiN | 33 | | 67 | | 95 | 5 | |
| 13 | TiAlN/ZrSiN | 50 | | 50 | | 95 | 5 | |
| 14 | TiAlN/ZrSiN | 33 | | 67 | | 95 | 5 | |
| 15 | TiAlN/ZrSiN | 33 | | 67 | | 95 | 5 | |
| 16 | TiAlN/ZrSiN | 33 | | 67 | | 95 | 5 | |
| 20 | TiAlCrN/ZrSiN | 30 | | 60 | 10 | 95 | 5 | |
| 21 | TiAlSiN/ZrSiN | 30 | | 60 | 10 | 95 | 5 | |
| 22 | TiAlNbN/ZrSiN | 30 | | 60 | 10 | 95 | 5 | |
| 23 | TiAlN/ZrSiCrN | 40 | | 60 | | 85 | 5 | 10 |
| 24 | TiAlN/ZrSiTaN | 40 | | 60 | | 85 | 5 | 10 |
| 25 | TiAlCrN/ZrSiCrN | 30 | | 60 | 10 | 85 | 5 | 10 |
| Comparative | | | | | | | | |
| 26 | TiAlN | 33 | | 67 | | | | |
| 27 | TiAlN | 50 | | 50 | | | | |
| 28 | ZrSiN | | | | | 95 | 5 | |
| 29 | ZrSiN | | | | | 90 | 10 | |

TABLE 1-continued

| Coating | Description | Cathode composition-layer A (metal at. %) | | | | Cathode composition-layer B (metal at. %) | | |
|---|---|---|---|---|---|---|---|---|
| # | LayerA/LayerB | Ti | Cr | Al | Me1 | Zr | Si | Me2 |
| 17 | CrAlN/ZrSiN | | 60 | 40 | | 95 | 5 | |
| 18 | CrAlN/ZrSiN | | 45 | 55 | | 95 | 5 | |
| 19 | CrAlN/ZrSiN | | 33 | 67 | | 95 | 5 | |

Table 2 summarizes the results for the example coatings according to the embodiments of the invention and comparative coatings.

TABLE 2

| Coating | Description | Layer thickn. (nm) | | Layer A: $(Al_{x1}Me1_{100-x1})$ (metal at %) | | Layer B: $(Zr_{100-x2-z2}Si_{x2}Me2_{z2})$ (metal at %) | | | Average Composition (at %) | | | | | | | |
|---|---|---|---|---|---|---|---|---|---|---|---|---|---|---|---|---|
| # | Layer A/Layer B | A | B | x1 | 100 − x1 | 100 − x2 − z2 | x2 | z2 | Ti | Cr | Al | Zr | Si | Me1 | Me2 | N |
| Coatings according to embodiment of the invention | | | | | | | | | | | | | | | | |
| 1 | TiAlN/ZrSiN | 6 | 8 | 64 | 36 | 97 | 3 | | 7.7 | | 13.7 | 27.6 | 0.9 | | | 50.1 |
| 2 | TiAlN/ZrSiN | 6 | 7 | 49 | 51 | 97 | 3 | | 11.8 | | 11.3 | 26.2 | 0.8 | | | 49.8 |
| 3 | TiAlN/ZrSiN | 7 | 6 | 38 | 62 | 97 | 3 | | 16.4 | | 10.0 | 21.9 | 0.7 | | | 51.0 |
| 4 | TiAlN/ZrSiN | 6 | 8 | 64 | 36 | 96 | 4 | | 7.5 | | 13.3 | 26.5 | 1.1 | | | 51.6 |
| 5 | TiAlN/ZrSiN | 6 | 7 | 49 | 51 | 96 | 4 | | 11.9 | | 11.4 | 26.0 | 1.1 | | | 49.6 |
| 6 | TiAlN/ZrSiN | 7 | 6 | 38 | 62 | 96 | 4 | | 16.4 | | 10.0 | 21.7 | 0.9 | | | 51.0 |
| 7 | TiAlN/ZrSiN | 6 | 8 | 64 | 36 | 91 | 9 | | 7.3 | | 12.9 | 24.4 | 2.4 | | | 53.0 |
| 8 | TiAlN/ZrSiN | 6 | 7 | 9 | 51 | 91 | 9 | | 11.1 | | 10.7 | 23.1 | 2.3 | | | 52.8 |
| 9 | TiAlN/ZrSiN | 7 | 6 | 38 | 62 | 91 | 9 | | 16.4 | | 10.1 | 20.6 | 2.0 | | | 50.8 |
| 10 | TiAlN/ZrSiN | 3 | 3 | 64 | 36 | 96 | 4 | | 8.8 | | 15.7 | 23.5 | 1.0 | | | 51.0 |
| 11 | TiAlN/ZrSiN | 4 | 3 | 49 | 51 | 96 | 4 | | 14.3 | | 13.7 | 20.2 | 0.8 | | | 51.0 |
| 12 | TiAlN/ZrSiN | 12 | 10 | 64 | 36 | 96 | 4 | | 9.6 | | 17.1 | 21.4 | 0.9 | | | 51.0 |
| 13 | TiAlN/ZrSiN | 11 | 10 | 49 | 51 | 96 | 4 | | 13.2 | | 12.7 | 22.6 | 0.9 | | | 50.5 |
| 14 | TiAlN/ZrSiN | 5 | 15 | 64 | 36 | 96 | 4 | | 4.5 | | 8.0 | 35.8 | 1.5 | | | 50.3 |
| 15 | TiAlN/ZrSiN | 15 | 5 | 64 | 36 | 96 | 4 | | 13.6 | | 24.2 | 12.1 | 0.5 | | | 49.5 |
| 16 | TiAlN/ZrSiN | 25 | 25 | 64 | 36 | 96 | 4 | | 8.8 | | 15.7 | 23.5 | 1.0 | | | 51.0 |
| 20 | TiAlCrN/ZrSiN | 9 | 12 | 62 | 38 | 96 | 4 | | 6.2 | | 12.8 | 26.5 | 1.1 | 1.7 | | 51.6 |
| 21 | TiAlSiN/ZrSiN | 8 | 7 | 62 | 38 | 96 | 4 | | 8.4 | | 16.7 | 22.7 | 0.9 | 1.9 | | 49.4 |
| 22 | TiAlNbN/ZrSiN | 5 | 6 | 62 | 38 | 96 | 4 | | 6.9 | | 14.2 | 26.4 | 1.1 | 1.8 | | 49.6 |
| 23 | TiAlN/ZrSiCrN | 5 | 8 | 62 | 38 | 88 | 4 | 8 | 7.2 | | 11.7 | 26.5 | 1.2 | | 2.4 | 51.0 |
| 24 | TiAlN/ZrSiTaN | 5 | 6 | 62 | 38 | 89 | 4 | 7 | 8.3 | | 13.6 | 23.5 | 1.1 | | 1.8 | 51.7 |
| 25 | TiAlCrN/ZrSiCrN | 6 | 7 | 62 | 38 | 88 | 4 | 8 | 6.8 | | 14.0 | 23.2 | 1.1 | 1.8 | 2.1 | 51.0 |
| Comparative | | | | | | | | | | | | | | | | |
| 26 | TiAlN | | | | | | | | 18.6 | | 31.0 | | | | | 50.4 |
| 27 | TiAlN | | | | | | | | 24.5 | | 24.9 | | | | | 50.6 |
| 28 | ZrSiN | | | | | | | | | | | 47.0 | 2.0 | | | 51.0 |
| 29 | ZrSiN | | | | | | | | | | | 42.8 | 4.2 | | | 53 |
| 17 | CrAlN/ZrSiN | 7 | 8 | 40 | 60 | 96 | 4 | | | 14 | 9.3 | 25.6 | 1.1 | | | 50 |
| 18 | CrAlN/ZrSiN | 7 | 8 | 55 | 45 | 96 | 4 | | | 10.5 | 12.8 | 25.6 | 1.1 | | | 50.0 |
| 19 | CrAlN/ZrSiN | 8 | 8 | 66 | 34 | 96 | 4 | | | 8.5 | 16.5 | 24.0 | 1.0 | | | 50.0 |

Example 2

Coatings 2, 4-6, 8, 16, 18-21 and 26-29 were tested under the following conditions:
Geometry: CNMG120408-MF1
Application: Longitudinal turning
Work piece material: AISI 316 L
Cutting speed: 300 m/min
Feed: 0.15 mm/rev
Depth of cut: 1.5 mm
Tool life criteria: Flank wear (vb)>0.3 mm
The results are presented in Table 3.

TABLE 3

| Coating | Crater wear resistance | Flank wear resistance | Life time (min) |
|---|---|---|---|
| Coatings according to embodiments of the invention | | | |
| 2 | Good/Medium | Good | 12 |
| 4 | Good | Good | 14 |
| 5 | Good | Good/Medium | 14 |
| 6 | Good | Good/Medium | 14 |
| 8 | Good/Medium | Good/Medium | 12 |
| 16 | Medium | Good | 12 |

TABLE 3-continued

| Coating | Crater wear resistance | Flank wear resistance | Life time (min) |
|---|---|---|---|
| 20 | Good | Good/Medium | 14 |
| 21 | Good | Medium | 13 |
| Comparative | | | |
| 23 | Medium/Poor | Good | 12 |
| 24 | Medium | Good/Medium | 10 |
| 25 | Good | Medium | 8 |
| 26 | Good | Medium | 10 |
| 18 | Good/Medium | Good/Medium | 12 |
| 19 | Medium | Good | 12 |

The cutting results presented in Table 3 clearly indicate that all coatings tested, containing a nanolaminated structure, perform well compared to the comparative coatings with an overall good wear resistance. Coating 4 shows the best cutting results.

The invention claimed is:

1. A cutting tool insert for machining by chip removal comprising:
a body of a hard alloy selected from the group of cemented carbide, cermet, ceramics, cubic boron nitride based material or high speed steel; and
a hard and wear resistant PVD coating deposited on said body, wherein said coating comprises at least one polycrystalline nanolaminated structure having sequences of alternating A and B layers, where said layer A is $(Al_{x1}Me1_{1-x})N_{y1}$ with $0.3<x1<0.95$, $0.9<y1<1.1$ and Me1 is one or more of the elements Ti, Y, V, Nb, Mo, Si, and W, or Me1 is Ti and one or more of the following elements Y, V, Nb, Mo, Si, Cr and W, and said layer B is $(Zr_{1-x2-z2}Si_{x2}Me2_{z2})N_{y2}$ with $0<x2<0.30$, $0.90<y2<1.20$, $0\leq z2<0.25$ and Me2 is one or more of the elements Y, Ti, Nb, Ta, Cr, Mo, W and Al, the average individual thickness of the A and B layers being between 1 nm and 50 nm, and the nanolaminated structure having a thickness between 0.5 μm and 15 μm.

2. A cutting tool insert according to claim 1, wherein said layer A is $(Ti_{1-x1-z1}Al_{x1}Me1_{z1})N_{y1}$, where $0.3<x1<0.95$, $0.9<y1<1.1$, $0<z1<0.25$, and $(1-x1-z1)>0$, and Me1 is one or more of the elements Y, V, Nb, Mo, Si, Cr and W.

3. A cutting tool insert according to claim 1, wherein $0.45<x1<0.75$.

4. A cutting tool insert according to claim 1, wherein $0.96<y1<1.04$.

5. A cutting tool insert according to claim 1, wherein $0<x2<0.15$.

6. A cutting tool insert according to claim 1, wherein $0.90<y2<1.10$.

7. A cutting tool insert according to claim 2, wherein $0<z1<0.15$, and/or $0\leq z2<0.15$.

8. A cutting tool insert according to claim 2, wherein z1=0.

9. A cutting tool insert according to claim 1, wherein z2=0.

10. A cutting tool insert according to claim 1, wherein said nanolaminated structure comprises a phase mixture of cubic and hexagonal phases.

11. A cutting tool insert according to claim 1, wherein said nanolaminated structure has cubic phases.

12. A cutting tool insert according to claim 11, wherein the cubic phases are NaCl phases.

13. A cutting tool insert according to claim 1, wherein said coating comprises at least one innermost layer selected from the group of TiN, TiC, Ti(C,N) or (Ti,Al)N, followed by said nanolaminated structure and at least one outer layer selected from the group of TiN, TiC, Ti(C,N) or (Ti,Al)N, said coating having a total thickness between 1 μm and 20 μm.

14. A method of making a hard and wear resistant nanolaminated coating structure comprising growing sequences of alternating A: (Al,Me1)N and B: (Zr,Si,Me2)N layers by PVD, or cathodic arc evaporation, using fixture rotation and at least two opposing and different composite and/or alloyed cathodes for the A and B layers, respectively, and wherein Me1 is one or more of the elements Ti, Y, V, Nb, Mo, Si, and W, or Me1 is Ti and one or more of the following elements Y, V, Nb, Mo, Si, Cr and W, and Me2 is one or more of the elements: Y, Ti, Nb, Ta, Cr, Mo, W and Al in a reactive atmosphere containing $N_2$, at a total gas pressure between 1.0 Pa and 7.0 Pa, an evaporation current between 50 A and 200 A, a negative substrate bias between 0 V and 300 V, and a deposition temperature between 200° C. and 800° C.

15. A method of using a cutting tool insert for machining by chip removal, comprising the steps of:
providing a cutting tool insert, the insert including a body of a hard alloy selected from the group of cemented carbide, cermet, ceramics, cubic boron nitride based material or high speed steel and depositing at least one polycrystalline nanolaminated structure having sequences of alternating A and B layers, wherein said layer A is $(Al_{x1}Me1_{1-x1})N_{y1}$ with $0.3<x1<0.95$, $0.9<y1<1.1$ and Me1 is selected from the group of one or more of the elements Ti, Y, V, Nb, Mo, Si, and W, or Me1 is Ti and one or more of the following elements Y, V, Nb, Mo, Si, Cr and W, and said layer B is $(Zr_{1-x2-z2}Si_{x2}Me2_{z2})N_{y2}$ with $0<x2<0.30$, $0.90<y2<1.20$, $0\leq z2<0.25$ and Me2 is one or more of the elements Y, Ti, Nb, Ta, Cr, Mo, W and Al, the average individual thickness of the A and B layers being between 1 nm and 50 nm, and the nanolaminated structure having a thickness between 0.5 μm and 15 μm; and
specifically generating high temperatures, at cutting speeds of 50-400 m/min, with an average feed, per tooth in the case of milling, of 0.08-0.5 mm, depending on cutting speed and insert geometry.

16. The cutting tool insert according to claim 13, wherein the at least one innermost layer is a single layer of (Ti,Al)N.

17. The cutting tool insert according to claim 13, wherein the at least one innermost layer is a plurality of layers selected from the group of TiN, TiC, Ti(C,N) or (Ti,Al)N.

18. The cutting tool insert according to claim 13, wherein the at least one outer layer is a single layer of TiN.

19. The cutting tool insert according to claim 13, wherein the at least one outer layer is a plurality of layers selected from the group of TiN, TiC, Ti(C,N) or (Ti,Al)N.

20. The method of claim 14, wherein the reactive atmosphere includes a carrier gas of Ar.

21. The method of claim 14, wherein the total gas pressure is between 1.5 Pa and 4.0 Pa.

22. The method of claim 14, wherein the negative substrate bias is between 10 V and 150 V.

23. The method of claim 14, wherein the negative substrate bias is between 15 V and 100 V.

24. The method of claim 14, wherein the temperature is between 300° C. and 600° C.

25. The method of claim 15, wherein the cutting speed is 75-300 m/min.

26. The method of claim 15, wherein the average feed, per tooth is 0.1-0.4 mm.

* * * * *